(12) United States Patent
Nishimura et al.

(10) Patent No.: US 12,066,493 B2
(45) Date of Patent: Aug. 20, 2024

(54) BATTERY STATE ANALYSIS SYSTEM AND BATTERY STATE ANALYSIS METHOD

(71) Applicant: HONDA MOTOR CO., LTD., Tokyo (JP)

(72) Inventors: Takumi Nishimura, Wako (JP); Yuki Tominaga, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 0 days.

(21) Appl. No.: 18/112,523

(22) Filed: Feb. 22, 2023

(65) Prior Publication Data

US 2023/0314517 A1 Oct. 5, 2023

(30) Foreign Application Priority Data

Mar. 30, 2022 (JP) ................................. 2022-054921

(51) Int. Cl.
*G01R 31/367* (2019.01)
*G01R 31/389* (2019.01)
*G01R 31/392* (2019.01)

(52) U.S. Cl.
CPC ......... *G01R 31/367* (2019.01); *G01R 31/389* (2019.01); *G01R 31/392* (2019.01)

(58) Field of Classification Search
None
See application file for complete search history.

(56) References Cited

U.S. PATENT DOCUMENTS

| | | |
|---|---|---|
| 2012/0310571 A1 | 12/2012 | Takagi |
| 2013/0030736 A1 | 1/2013 | Tanaka |

(Continued)

FOREIGN PATENT DOCUMENTS

| | | |
|---|---|---|
| CN | 102859377 | 1/2013 |
| CN | 102901928 | 1/2013 |

(Continued)

OTHER PUBLICATIONS

Japanese Notice of Allowance for Japanese Patent Application No.2022-054921 mailed Oct. 24, 2023.

(Continued)

*Primary Examiner* — Roy Y Yi
(74) *Attorney, Agent, or Firm* — Amin, Turocy & Watson, LLP

(57) ABSTRACT

A battery state analysis system includes a server device configured to analyze a state of a battery. The server device includes: a communication unit configured to receive a plurality of pieces of characteristic data; and a diagnosis unit configured to prepare a deterioration model by modeling resistance deterioration rates of a plurality of batteries and to analyze a deterioration state of the battery on the basis of a result of comparison between the deterioration model and the plurality of pieces of characteristic data. The diagnosis unit is configured to generate training data indicating the resistance deterioration rates by processing the resistance deterioration rates of the plurality of batteries using an experimental design method on acquired in advance, to remove an error by processing the training data using a variance analysis method, and to prepare the deterioration model by performing surface fitting on the training data on the basis of a deterioration transition expression.

2 Claims, 5 Drawing Sheets

(56) References Cited

U.S. PATENT DOCUMENTS

| | | | |
|---|---|---|---|
| 2014/0159736 A1 | 6/2014 | Morimoto et al. | |
| 2015/0323611 A1 | 11/2015 | Kise et al. | |
| 2017/0031404 A1 | 2/2017 | Yamamoto et al. | |
| 2019/0115778 A1 | 4/2019 | Ermon et al. | |
| 2019/0146038 A1* | 5/2019 | Matsumoto | B60L 3/12 324/430 |
| 2019/0271747 A1 | 9/2019 | Osaka et al. | |
| 2019/0331738 A1 | 10/2019 | Kodama | |
| 2020/0384884 A1 | 12/2020 | Namiki | |
| 2021/0138929 A1 | 5/2021 | Kazuno et al. | |
| 2021/0156921 A1 | 5/2021 | Kazuno et al. | |
| 2021/0181256 A1 | 6/2021 | Kawamura et al. | |
| 2021/0268933 A1 | 9/2021 | Kazuno | |
| 2021/0382114 A1 | 12/2021 | Oyama et al. | |
| 2022/0099745 A1* | 3/2022 | Kroener | B60L 58/16 |

FOREIGN PATENT DOCUMENTS

| | | |
|---|---|---|
| CN | 106796267 | 5/2017 |
| CN | 109670196 | 4/2019 |
| CN | 109716153 | 5/2019 |
| CN | 110416635 | 11/2019 |
| CN | 111983455 | 11/2020 |
| CN | 112531694 | 3/2021 |
| CN | 112776662 | 5/2021 |
| CN | 112829588 | 5/2021 |
| CN | 113320389 | 8/2021 |
| EP | 1887370 | 2/2008 |
| JP | 2016-166857 | 9/2016 |
| JP | 2019-90792 | 6/2019 |
| WO | 2006/129802 | 12/2006 |
| WO | 2013/018143 | 2/2013 |
| WO | 2020/027203 | 2/2020 |
| WO | 2020/090143 | 5/2020 |

OTHER PUBLICATIONS

Chinese Notice of Allowance for Chinese Patent Application No. 202310117692.7 mailed Jan. 9, 2024.

* cited by examiner

BATTERY STATE ANALYSIS SYSTEM AND BATTERY STATE ANALYSIS METHOD

CROSS-REFERENCE TO RELATED APPLICATION

Priority is claimed on Japanese Patent Application No. 2022-054921, filed Mar. 30, 2022, the content of which is incorporated herein by reference.

BACKGROUND OF THE INVENTION

Field of the Invention

The present invention relates to a battery state analysis system and a battery state analysis method.

Description of Related Art

Recently, for example, vehicles that run using at least an electric motor which is driven with electric power supplied from a battery (a secondary battery) such as electric vehicles (EVs) or hybrid electric vehicles (HEVs) have been developed. Interest in such vehicles running using an electric motor has been much increased in view of reduction of $CO_2$ for the purpose of curbing occurrence of climate-related disasters.

In a vehicle traveling using an electric motor, it is important to always know a deterioration state of a battery. Accordingly, many techniques for determining a deterioration state of a battery mounted in a vehicle have been disclosed in the related art.

For example, Japanese Unexamined Patent Application, First Publication No. 2016-166857 and PCT International Publication No. WO 2013/018143 disclose that a battery state is estimated on the basis of a battery model which has been generated in advance.

PCT International Publication No. WO 2006/129802 discloses that a residual capacity of a battery is estimated through a method using an approximate expression including a plurality of exponential functions of time and a plurality of coefficients.

SUMMARY OF THE INVENTION

In the related art, a method of acquiring resistance deterioration rates of a plurality of batteries in advance, preparing a deterioration model through modeling the resistance deterioration rates, and comparing the deterioration model with characteristic data of an actual cell (battery) has been proposed as a technique for determining a deterioration state of a battery. With this method, training data of the resistance deterioration rates of the batteries acquired in advance is generated and surface fitting is performed on the training data on the basis of a deterioration transition expression defined as $y=axt^b+1$. The deterioration transition expression is an expression which is used for a lithium-ion battery, where y is a constant, a is a deterioration condition-dependent coefficient, b is a deterioration mechanism-dependent coefficient, and t denotes time. Modeling is performed by learning the coefficients a and b in the deterioration transition expression through the surface fitting process, and a deterioration model is prepared.

However, there is a problem in that a large number of experiments is required to generate training data using the aforementioned method.

Therefore, it has been tried to acquire training data with a decrease in the number of experiments, for example, by performing an experimental design method called a Taguchi method. However, when the number of experiments is decreased, an influence of deterioration unevenness by individuals in addition to an influence of inter-solid unevenness of a cell (battery) or an error occurring at the time of measurement becomes apparent. Specifically, condition A is deterioration of a, but deterioration of a+α progresses by experiment, and an influence thereof becomes apparent when an influence of factors is modeled with a small number of experiments. Accordingly, since fitting affects the deterioration mechanism-dependent coefficient b in the deterioration transition expression, a fitting error occurs, the influence thereof spreads to the deterioration condition-dependent coefficient a, and accuracy of the deterioration model which is generated by learning the acquired coefficients a and b decreases. As a result, when the deterioration model is compared with characteristic data of an actual cell (battery), there is a problem in that accuracy of analysis or determination of a deterioration state decreases significantly.

Aspects of the present invention were invented in consideration of the aforementioned circumstances and an objective thereof is to provide a battery state analysis system and a battery state analysis method that can generate a deterioration model used to analyze a deterioration state of a battery with high accuracy and analyze the deterioration state of the battery using the deterioration model with high accuracy.

In order to solve the aforementioned problem and to achieve the aforementioned objective, the present invention employs the following aspects.

(1) A battery state analysis system according to an aspect of the present invention is a battery state analysis system including at least a server device configured to analyze a state of a battery, wherein the server device includes: a reception unit configured to receive a plurality of pieces of characteristic data indicating characteristics associated with change of the state of the battery based on physical quantity data indicating a physical quantity associated with the state of the battery; and an analysis unit configured to prepare a deterioration model by modeling resistance deterioration rates of a plurality of batteries which have been acquired in advance and to analyze a deterioration state of the battery on the basis of a result of comparison between the deterioration model and the plurality of pieces of characteristic data, and the analysis unit is configured to generate training data indicating the resistance deterioration rates of the plurality of batteries by performing a process based on an experimental design method on the resistance deterioration rates of the plurality of batteries acquired in advance, to remove an error included in the training data by performing a process based on a variance analysis method on the training data, and to model the resistance deterioration rates of the plurality of batteries to prepare the deterioration model by determining a deterioration mechanism-dependent coefficient b with which the error is minimized through performing surface fitting on the training data from which the error has been removed using the variance analysis method on the basis of a deterioration transition expression expressed by $\{y=axt^b+1\}$ (where y is a constant, a is a deterioration condition-dependent coefficient, b is a deterioration mechanism-dependent coefficient, and t is time) and calculating the deterioration condition-dependent coefficient a through performing surface fitting using the deterioration transition expression on the basis of the determined deterioration mechanism-dependent coefficient b.

(2) A battery state analysis method according to another aspect of the present invention is a battery state analysis method using a battery state analysis system including at least a server device configured to analyze a state of a battery, the battery state analysis method being performed by a computer of the server device, the battery state analysis method including: receiving a plurality of pieces of characteristic data indicating characteristics associated with change of the state of the battery based on physical quantity data indicating a physical quantity associated with the state of the battery; preparing a deterioration model by modeling resistance deterioration rates of a plurality of batteries which have been acquired in advance and analyzing a deterioration state of the battery on the basis of a result of comparison between the deterioration model and the plurality of pieces of characteristic data; generating training data indicating the resistance deterioration rates of the plurality of batteries by performing a process based on an experimental design method on the resistance deterioration rates of the plurality of batteries acquired in advance; removing an error included in the training data by performing a process based on a variance analysis method on the training data; and modeling the resistance deterioration rates of the plurality of batteries to prepare the deterioration model by determining a deterioration mechanism-dependent coefficient b with which the error is minimized through performing surface fitting on the training data from which the error has been removed using the variance analysis method on the basis of a deterioration transition expression expressed by $\{y=a \times t^b + 1\}$ (where y is a constant, a is a deterioration condition-dependent coefficient, b is a deterioration mechanism-dependent coefficient, and t is time) and calculating the deterioration condition-dependent coefficient a through performing surface fitting using the deterioration transition expression on the basis of the determined deterioration mechanism-dependent coefficient b.

With the battery state analysis system according to the aspect of (1) and the battery state analysis method according to the aspect of (2), since a deterioration model of a battery can be accurately generated, it is possible to accurately analyze the deterioration state of the battery using the deterioration model. Particularly, by taking measures for a decrease in resistance, it is possible to accurately analyze a deterioration state of a battery using the accurately generated deterioration model even if the battery is a next-generation battery or the like in which an influence of a modeling error is more significant.

DETAILED DESCRIPTION OF THE INVENTION

Hereinafter, a battery state analysis system and a battery state analysis method according to an embodiment of the present invention will be described with reference to FIGS. 1 to 5. In the following description, it is assumed that the battery state analysis system and the battery state analysis method according to the present invention are employed by an electric vehicle (EV) (hereinafter also simply referred to as a "vehicle"), but the battery state analysis system and the battery state analysis method according to the present invention are not limited to a battery mounted in a vehicle and can be applied to a battery not mounted in a vehicle.

[Configuration of Vehicle Employing Battery State Analysis System]

Figure 1:
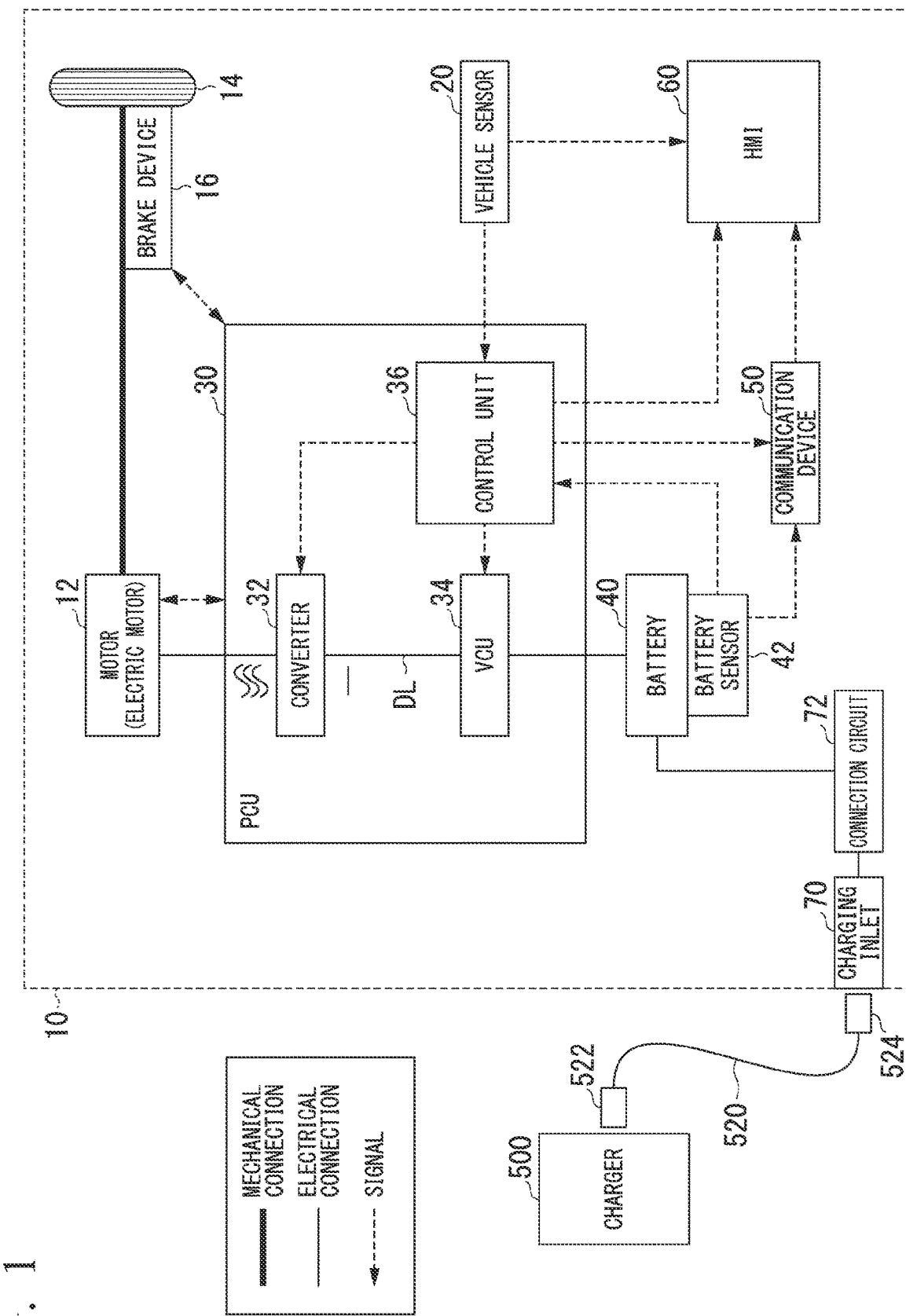
FIG. 1 is a diagram illustrating an example of a configuration of a vehicle employing a battery state analysis system according to an embodiment.

FIG. 1 is a diagram illustrating an example of a configuration of a vehicle 10 employing a battery state analysis system 1 according to the embodiment. The vehicle illustrated in FIG. 1 is a battery electric vehicle (BEV) (electric vehicle) traveling using a motor (an electric motor) that is driven with electric power supplied from a traveling battery (a lithium-ion battery). The vehicle 10 includes, for example, all vehicles traveling through operation of an internal combustion engine or using an electric motor which is driven with electric power supplied from a battery such as a straddling type vehicle with two wheels, a vehicle with three wheels (including a vehicle with two wheels on the front and one wheel on the rear in addition to a vehicle with one wheel on the front and two wheels on the rear), and an assist type bicycle in addition to a vehicle with four wheels.

The vehicle 10 illustrated in FIG. 1 includes, for example, a motor 12, driving wheels 14, a brake device 16, a vehicle sensor 20, a power control unit (PCU) 30, a battery 40, a battery sensor (acquisition unit) 42 such as a voltage sensor, a current sensor, and a temperature sensor, a communication device (transmission unit) 50, a human-machine interface (HMI) 60 including a display device, a charging inlet 70, and a connection circuit 72.

The motor 12 is, for example, a three-phase AC electric motor. A rotor of the motor 12 is connected to the driving wheels 14. The motor 12 is driven with electric power supplied from a power storage unit (not illustrated) provided in the battery 40 and transmits a rotational force to the driving wheels 14. The motor 12 generates electric power using kinetic energy of the vehicle 10 when the vehicle 10 decelerates.

The brake device 16 includes, for example, a brake caliper, a cylinder that transmits a hydraulic pressure to the brake caliper, and an electric motor that generates a hydraulic pressure in the cylinder. The brake device 16 may include a mechanism for transmitting a hydraulic pressure generated by a user's (driver's) operation of a brake pedal which is not illustrated in the vehicle 10 to the cylinder via a master cylinder as a backup mechanism. The brake device 16 is not limited to the above-mentioned configuration, and may be, for example, an electronically controlled hydraulic brake device that transmits the hydraulic pressure of the master cylinder to the cylinder.

The vehicle sensor 20 includes, for example, an accelerator position sensor, a vehicle speed sensor, and a brake position sensor. The accelerator position sensor is attached to an accelerator pedal, detects an amount of operation on the accelerator pedal by a driver, and outputs the detected amount of operation as an accelerator operation amount to a control unit (observation unit) 36 provided in the PCU 30 which will be described later. The vehicle speed sensor includes, for example, a wheel speed sensor attached to each wheel of the vehicle 10 and a speed calculator, derives a speed of the vehicle 10 (a vehicle speed) by combining the wheel speeds detected by the wheel speed sensors, and outputs the vehicle speed to the control unit 36 and the HMI 60. The brake position sensor is attached to a brake pedal, detects an amount of operation on a brake pedal by a driver, and outputs the detected amount of operation as a brake depression amount to the control unit 36.

The PCU 30 includes, for example, a converter 32, a voltage control unit (VCU) 34, and a control unit 36. In FIG. 1, these elements are unified as the single PCU 30, which is only an example, and these elements in the vehicle 10 may be dispersedly provided.

The converter 32 is, for example, an AC-DC converter. A DC-side terminal of the converter 32 is connected to a DC link DL. The battery 40 is connected to the DC link DL via the VCU 34. The converter 32 converts AC electric power generated by the motor 12 to DC electric power and outputs the DC electric power to the DC link DL.

The VCU 34 is, for example, a DC-DC converter. The VCU 34 steps up electric power supplied from the battery 40 and outputs the stepped-up electric power to the DC link DL.

The control unit 36 includes, for example, a motor control unit, a brake control unit, and a battery and VCU control unit. The motor control unit, the brake control unit, and the battery and VCU control unit may be replaced with separate control devices such as a motor electronic control unit (ECU), a brake ECU, and a battery ECU.

The control unit 36 or the motor control unit, the brake control unit, and the battery and VCU control unit which are provided in the control unit 36 are implemented, for example, by causing a hardware processor such as a central processing unit (CPU) to execute a program (software). Some or all of such elements may be implemented by hardware (a circuit unit including circuitry) such as a large scale integration (LSI) circuit, an application-specific integrated circuit (ASIC), a field-programmable gate array (FPGA), or a graphics processing unit (GPU) or may be cooperatively implemented by software and hardware. Some or all of the functions of the elements may be implemented by a dedicated LSI. The program may be stored in a storage device (a storage device including a non-transitory storage medium) such as a hard disk drive (HDD) or a flash memory of the vehicle 10 in advance. Alternatively, the program may be stored in a removable storage medium (a non-transitory storage medium) such as a DVD or a CD-ROM and be installed in the HDD or the flash memory of the vehicle 10 by setting the removable storage medium in a drive device of the vehicle 10.

The motor control unit of the control unit 36 controls driving of the motor 12 on the basis of an output from the accelerator position sensor of the vehicle sensor 20. The brake control unit of the control unit 36 controls the brake device 16 on the basis of an output from the brake position sensor of the vehicle sensor 20. The battery and VCU control unit of the control unit 36 calculates, for example, a state of charge (SOC) of the battery 40 on the basis of an output from the battery sensor 42 which will be described later and which is connected to the battery 40 and outputs the calculated SOC to the VCU 34 and the HMI 60. The control unit 36 may output information of the vehicle speed output from the vehicle sensor 20 to the HMI 60. The VCU 34 steps up a voltage of the DC link DL in accordance with an instruction from the battery and VCU control unit.

The battery 40 is, for example, a secondary battery which can be repeatedly charged and discharged such as a lithium-ion battery. Examples of a secondary battery constituting the battery 40 include a capacitor such as an electric double-layer capacitor and a composite battery in which a secondary battery and a capacitor are combined in addition to a lead storage battery, a nickel-hydride battery, and a sodium-ion battery. In the present invention, a configuration of the secondary battery in the battery 40 is not particularly limited. The battery 40 may be, for example, a cassette type battery pack which is detachably mounted in the vehicle 10. The battery 40 stores electric power supplied from an external charger 500 outside of the vehicle 10 and discharges electric power for traveling of the vehicle 10.

The battery sensor 42 detects physical quantities such as a current, a voltage, and a temperature of the battery 40.

The battery sensor 42 includes, for example, a current sensor, a voltage sensor, and a temperature sensor. The battery sensor 42 detects a current of a secondary battery constituting the battery 40 (hereinafter simply referred to as a "battery 40") using the current sensor, detects a voltage of the battery 40 using the voltage sensor, and detects the temperature of the battery 40 using the temperature sensor. The battery sensor 42 outputs data of the detected physical quantities (hereinafter referred to as "physical quantity data") such as a current value, a voltage value, and a temperature of the battery 40 to the control unit 36 or the communication device 50. The battery sensor 42 is an example of an "acquisition unit" in the claims.

The control unit 36 observes the physical quantity data such as the current value, the voltage value, and the temperature of the battery 40 which have been detected and output by the battery sensor 42 and calculates characteristics associated with change of a state of the battery 40 which are used to analyze (diagnose or determine) a deterioration state of the battery 40. For example, the control unit 36 observes a current value, a voltage value, and a capacity value (which is calculated from a positive-electrode value and a negative-electrode value) output from the battery sensor 42 and calculates a resistance deterioration rate indicating change of the state of the battery 40. The control unit 36 may calculate the resistance deterioration rate indicating change of the state of the battery 40 on the basis of the current value, the voltage value, and the capacity value observed in a predetermined observation time, for example, with reference to relationships between the current value, the voltage value, and the capacity value observed in a predetermined observation time. A plurality of times (periods) are set as the predetermined observation time. The predetermined observation time may be, for example, periods of 5 seconds, 10 seconds, and 15 seconds. The periods are set as individual observation times in a state in which the battery 40 is charged and a state in which the battery 40 is discharged. When a period in which the state of the battery 40 is continuously maintained in the same state corresponds to one of the "predetermined observation times," physical quantity data observed in the period is employed as observation data in the corresponding observation time.

For example, physical quantity data observed in a period in which the battery 40 continues to discharge electric power for 5 seconds is employed as observation data in a discharging time of 5 seconds. For example, physical quantity data observed in a period in which the battery 40 continues to discharge electric power for 10 seconds is employed as observation data in a discharging time of 10 seconds. When the number of corresponding predetermined observation times is two or more, the same physical quantity data may be duplicately employed as observation data in different observation times. For example, physical quantity data in 5 seconds subsequent thereto out of the physical quantity data observed in the period in which the battery 40 continues to discharge electric power for 10 seconds may be employed as observation data for both the observation data in a discharging time of 5 seconds and the observation data in a discharging time of 10 seconds.

The control unit 36 outputs data indicating characteristics (hereinafter referred to as "characteristic data") associated with change of the state of the battery 40 which is calculated on the basis of the observed physical quantity data (observation data) to the communication device 50. The control unit 36 is an example of an "observation unit" in the claims.

The communication device 50 includes a wireless module for connection to a cellular network or a Wi-Fi network.

The communication device 50 may include a wireless module for use of Bluetooth (registered trademark). The communication device 50 transmits and receives various types of information associated with the vehicle 10, for example, to and from a server device (which will be described later) which manages traveling of the vehicle 10 or the state of the battery 40 and which is provided over a network (not illustrated) through communication using the wireless module. The communication device 50 transmits the characteristic data of the battery 40 output from the control unit 36 to a server device 200 which will be described later. The communication device 50 may receive information indicating a deterioration state of the battery 40 which are analyzed by the server device 200 which will be described later and transmitted from the server device 200 and output the received information indicating the deterioration state of the battery 40 to the HMI 60. The communication device 50 is an example of a "transmission unit" in the claims.

The HMI 60 presents various types of information to a user of the vehicle 10 such as a driver and receives an input operation from the user. The HMI 60 is, for example, a so-called touch panel in which a display device such as a liquid crystal display (LCD) and an input device for sensing an input operation are combined. The HMI 60 may include various display units, a speaker, a buzzer instead of the display device and a switch or keys instead of the input device. The HMI 60 may share the display device or the input device thereof with, for example, a display device or an input device of an onboard navigation device.

The charging inlet 70 is a mechanism used to charge the battery 40 (lithium-ion battery). The charging inlet 70 is provided to face the outside of the vehicle 10. The charging inlet 70 is connected to a charger 500 via a charging cable 520. The charging cable 520 includes a first plug 522 and a second plug 524. The first plug 522 is connected to the charger 500, and the second plug 524 is connected to the charging inlet 70. Electric power supplied from the charger 500 is input (supplied) to the charging inlet 70 via the charging cable 520.

The charging cable 520 includes a signal cable which is installed in a power cable. The signal cable relays communication between the vehicle 10 and the charger 500. Accordingly, each of the first plug 522 and the second plug 524 includes a power connector for connection to the power cable and a signal connector for connection to the signal cable.

The connection circuit 72 is provided between the charging inlet 70 and the battery 40. The connection circuit 72 transmits a current, for example, a direct current, introduced from the charger 500 via the charging inlet 70 as a current to be supplied to the battery 40. The connection circuit 72 outputs, for example, a direct current to the battery 40 and causes the battery 40 (lithium-ion battery) to store (be charged with) electric power.

[Configuration of Battery State Analysis System]

Figure 2:
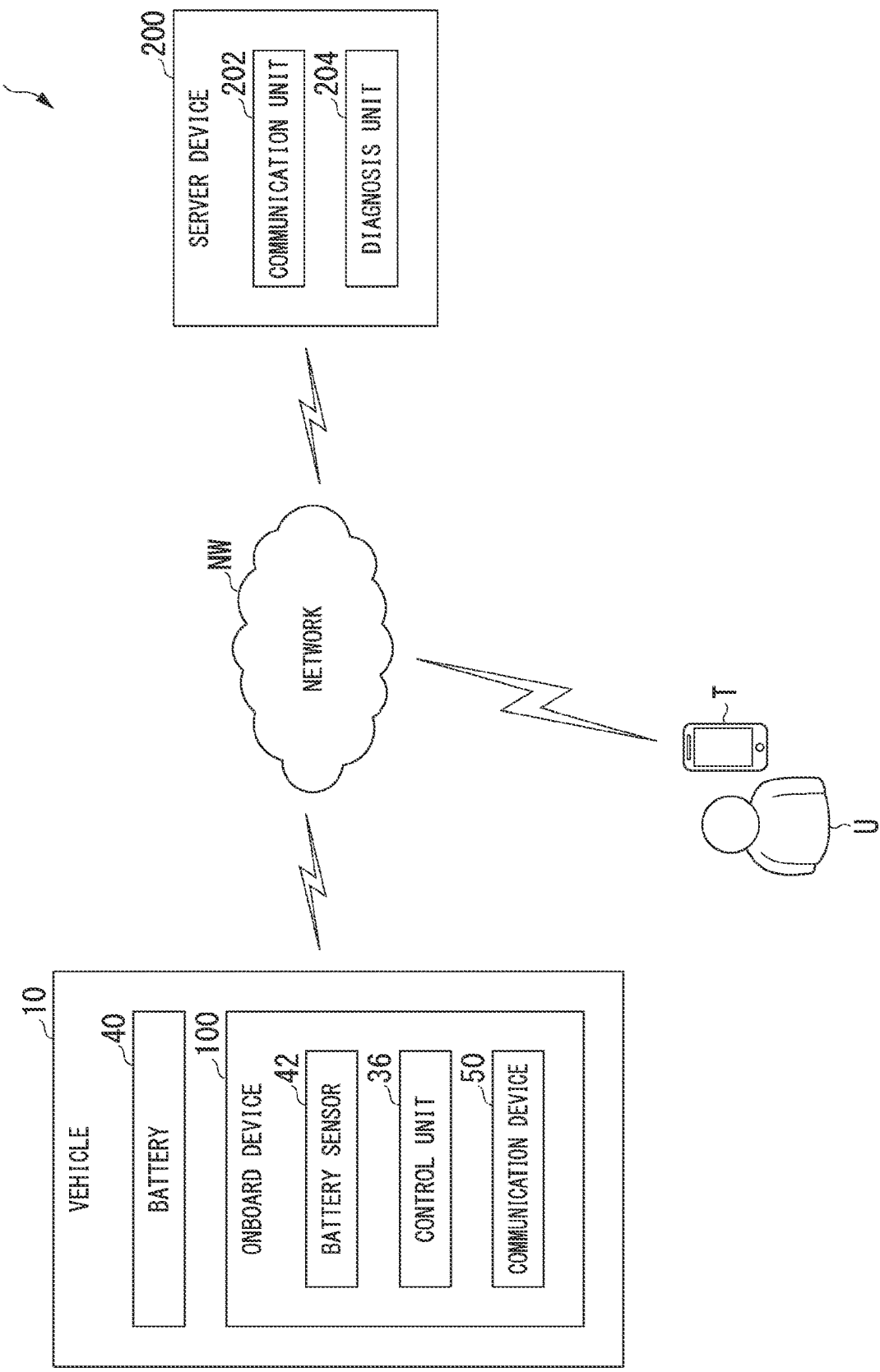
FIG. 2 is a diagram illustrating an example of a configuration of the battery state analysis system according to the embodiment.

An example of the battery state analysis system including the vehicle 10 in which the battery 40 is mounted will be described below. FIG. 2 is a diagram illustrating an example of the configuration of the battery state analysis system 1 according to the embodiment.

The battery state analysis system 1 illustrated in FIG. 2 roughly includes, for example, an onboard device 100 provided in the vehicle 10 in which the battery 40 is mounted and a server device 200.

The communication device 50 and the server device 200 communicate with each other via a network NW.

The network NW is, for example, a wireless communication network including the Internet, a wide area network (WAN), a local area network (LAN), a provider device, and a wireless base station. In FIG. 2, a state in which a user terminal T is connected to the network NW is illustrated. In this case, for example, the server device 200 can also communicate with the user terminal T via the network NW.

The battery state analysis system 1 is a system that analyzes and determines a deterioration state of the battery 40 provided in the vehicle 10. In the battery state analysis system 1, the onboard device 100 provided in the vehicle 10 transmits calculated characteristic data associated with change of the state of the battery 40 to the server device 200 via the network NW. In the battery state analysis system 1, the server device 200 analyzes the deterioration state of the battery 40 provided in the vehicle 10 on the basis of the characteristic data transmitted from the onboard device 100. In the battery state analysis system 1, the server device 200 transmits information of a result of analysis (an analysis result) of the deterioration state of the battery 40 to the vehicle 10 via the network NW.

Accordingly, for example, the HMI 60 of the vehicle 10 displays the information of the analysis result transmitted from the server device 200, for example, on the display device and presents the information to a user of the vehicle 10. In the battery state analysis system 1, the server device 200 may transmit the information of the analysis result of the deterioration state of the battery 40 to the user terminal T via the network NW. Accordingly, the user terminal T can notify, for example, the user of the vehicle 10 of the information of the analysis result transmitted from the server device 200.

In the battery state analysis system 1, the server device 200 may learn the deterioration state of the battery 40 on the basis of the analysis result of the deterioration state of the battery 40. Accordingly, the server device 200 in the battery state analysis system 1 can more appropriately manage the deterioration state of the battery 40 provided in the vehicle 10.

The onboard device 100 includes, for example, a battery sensor (an acquisition unit) 42 that acquires physical quantity data indicating a physical quantity associated with the state of the battery 40 mounted in the vehicle 10, a control unit (an observation unit) 36 that observes characteristics associated with change of the state of the battery 40 on the basis of the physical quantity data at a plurality of different observation times, and a communication device (a transmission unit) 50 that transmits a plurality of pieces of characteristic data indicating the observed characteristics to the server device 200.

The battery sensor 42 detects a current value, a voltage value, and a temperature of the battery 40, for example, at intervals of 10 milliseconds. The battery sensor 42 outputs the detected physical quantity data such as the current value, the voltage value, and the temperature of the battery 40 to the control unit 36.

The control unit 36 observes the physical quantity data such as the current value, the voltage value, the capacity value, and the temperature of the battery 40 output from the battery sensor 42 and generates characteristic data indicating the state of the battery 40 on the basis of the observed physical quantity data. Characteristic data is, for example, data indicating the resistance deterioration rate of the battery 40 which is used to analyze the deterioration state of the battery 40. The control unit 36 can be configured to generate, for example, characteristic data in observation times in which a discharging time is 5 seconds, 10 seconds, and 15 seconds or characteristic data in observation times in which a charging time is 5 seconds, 10 seconds, and 15 seconds. In this case, the control unit 36 counts a period of each observation time, for example, using a timer function and generates characteristic data therein on the basis of physical quantity data observed in the counted period of the corresponding observation time. For example, when characteristic data indicating a resistance deterioration rate in the observation time with a discharging time of 5 seconds is generated, the control unit 36 counts 5 seconds in which the battery 40 continues to discharge electric power and generates characteristic data indicating a resistance deterioration rate on the basis of the corresponding voltage value and the corresponding capacity value acquired, for example, by observing the physical quantity data of the battery 40 detected and output by the battery sensor 42, for example, at intervals of 10 milliseconds in the counted period. Similarly, the control unit 36 generates characteristic data in the observation times with a discharging time of 10 seconds and a discharging of 15 seconds or characteristic data indicating a resistance deterioration rate in the observation times with a charging time of 5 seconds, a charging time of 10 seconds, and a charging time of 15 seconds.

The control unit 36 may use physical quantity data observed at the start time of an observation time and physical quantity data observed at the end time of the observation time as characteristic data. That is, the control unit 36 may use a group of two current values, two voltage values, and two capacity values (four pieces of physical quantity data) at the start time and the end time of an observation time as one piece of characteristic data indicating a resistance deterioration rate.

The control unit 36 outputs the generated characteristic data to the communication device 50 along with information of the observation time and information indicating whether the battery 40 is charged or discharged. The characteristic data may include information indicating change of the temperature of the battery 40 or information indicating an SOC of the battery 40 (a battery charging rate).

The communication device 50 transmits the characteristic data of the battery 40 output from the control unit 36 to the server device 200 by communication using the network NW.

The user terminal T is, for example, a terminal device such as a smartphone or a tablet terminal which is carried by a user of the user terminal T (hereinafter also referred to as a "user U") such as a driver of the vehicle 10. For example, the user terminal T may be a stationary terminal device which is used by the user U. In the user terminal T, an application for ascertaining or notifying of the deterioration state of the battery 40 (hereinafter referred to as a "battery ascertainment application") or the like is being executed. When information of an analysis result transmitted from the server device 200 is received, the user terminal T presents the received information of the analysis result to the user U, for example, by displaying the information on a display device. The user U can request ascertainment of the current deterioration state of the battery 40 from the server device 200 at an arbitrary timing by operating the battery ascertainment application which is being executed in the user terminal T. In this case, the user terminal T transmits an ascertainment request for requesting transmission of the deterioration state of the battery 40 to the server device 200 via the network NW.

The server device 200 manages the deterioration state of the battery 40 provided in the vehicle 10. The server device 200 includes, for example, a communication unit (a reception unit) 202 and a diagnosis unit (an analysis unit) 204. The communication unit 202 and the diagnosis unit 204 are implemented, for example, by causing a hardware processor such as a CPU to execute a program (software). Some or all of such elements may be implemented by hardware (a circuit unit including circuitry) such as an LSI circuit, an ASIC, an FPGA, or a GPU or may be cooperatively implemented by software and hardware. Some or all of the functions of the elements may be implemented by a dedicated LSI circuit. The program may be stored in a storage device (a storage device including a non-transitory storage medium) such as an HDD or a flash memory of the server device 200 in advance. Alternatively, the program may be stored in a removable storage medium (a non-transitory storage medium) such as a DVD or a CD-ROM and be installed in the HDD or the flash memory of the server device 200 by setting the removable storage medium to a drive device of the server device 200.

The communication unit 202 transmits and receives information to and from the communication device 50 of the vehicle 10 or the user terminal T by communicating therewith via the network NW. The communication unit 202 receives characteristic data of the battery 40 transmitted from the onboard device 100 of the vehicle 10 by communication using the network NW. The communication unit 202 outputs the received characteristic data of the battery 40 to the diagnosis unit 204. When an ascertainment request of the battery 40 transmitted from the user terminal T is received by communication using the network NW, the communication unit 202 outputs the received ascertainment request of the battery 40 to the diagnosis unit 204. The communication unit 202 is an example of a "reception unit" in the claims.

The diagnosis unit 204 analyzes the deterioration state of the battery 40 on the basis of the characteristic data of the battery 40 output from the communication unit 202. More specifically, the diagnosis unit 204 collects the characteristic data of the battery 40 output from the communication unit 202 separately for each observation time included in the characteristic data. Then, the diagnosis unit 204 analyzes the deterioration state of the battery 40 with reference to the characteristic data group including the collected plurality of pieces of characteristic data in a predetermined observation time.

In the battery state analysis system 1 according to the embodiment, a diagnosis unit 204 provided in the server device 200 prepares a deterioration model by modeling resistance deterioration rates of a plurality of batteries 40 which have been acquired in advance and analyzes the deterioration state of the battery 40 on the basis of a result of comparison between the deterioration model and the plurality of pieces of characteristic data. More specifically, the diagnosis unit 204 generates training data indicating the resistance deterioration rates of the plurality of batteries 40 by performing a process based on an experimental design method on the resistance deterioration rates of the plurality of batteries 40 acquired in advance. The diagnosis unit 204 removes an error included in the training data by performing a process based on a variance analysis method on the training data. Then, the diagnosis unit 204 performs surface fitting on the training data from which the error has been removed using the variance analysis method on the basis of a deterioration transition expression expressed by $\{y=a \times t^b+1\}$ (where y is a constant, a is a deterioration condition-dependent coefficient, b is a deterioration mechanism-dependent coefficient, and t is time). Through this process, the diagnosis unit 204 models the resistance deterioration rates of the plurality of batteries 40 to prepare the deterioration model by determining the deterioration mechanism-dependent coefficient b with which the error is minimized and calculating the deterioration condition-dependent coefficient a through performing surface fitting using the deterioration transition expression on the basis of the determined deterioration mechanism-dependent coefficient b.

For example, when the resistance deterioration rate is transmitted from the onboard device 100, the diagnosis unit 204 compares a characteristic data group including the characteristic data indicating a plurality of resistance deterioration rates in a predetermined observation time with the deterioration model generated in advance and analyzes the deterioration state of the battery 40 on the basis of the result of comparison. The predetermined observation time used as a reference by the diagnosis unit 204 at the time of analysis of the deterioration state of the battery 40 is, for example, a characteristic data group in which the observation time is 5 seconds which is the shortest and which can be most frequently collected. The diagnosis unit 204 uses the characteristic data group of an observation time other than the reference observation time as an assist for analyzing the deterioration state of the battery 40. For example, when the characteristic data group in which the observation time is 5 seconds is used as a reference, the diagnosis unit 204 uses the characteristic data group in which the observation time is 10 seconds or 15 seconds to correct the analysis result of the deterioration state of the battery 40. The diagnosis unit 204 is an example of an "analysis unit" in the claims.

An example of a process of generating a deterioration model of a plurality of batteries 40 which is performed by the diagnosis unit 204 in advance will be described below in detail.

Figure 3:
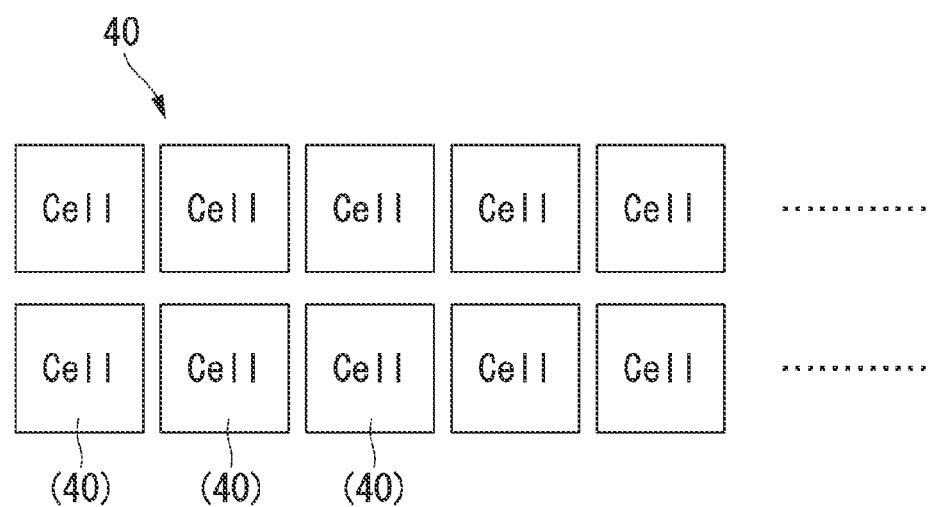
FIG. 3 is a diagram schematically illustrating a cell structure of a battery 40 that is mounted in a vehicle employing the battery state analysis system according to the embodiment.
Figure 4:
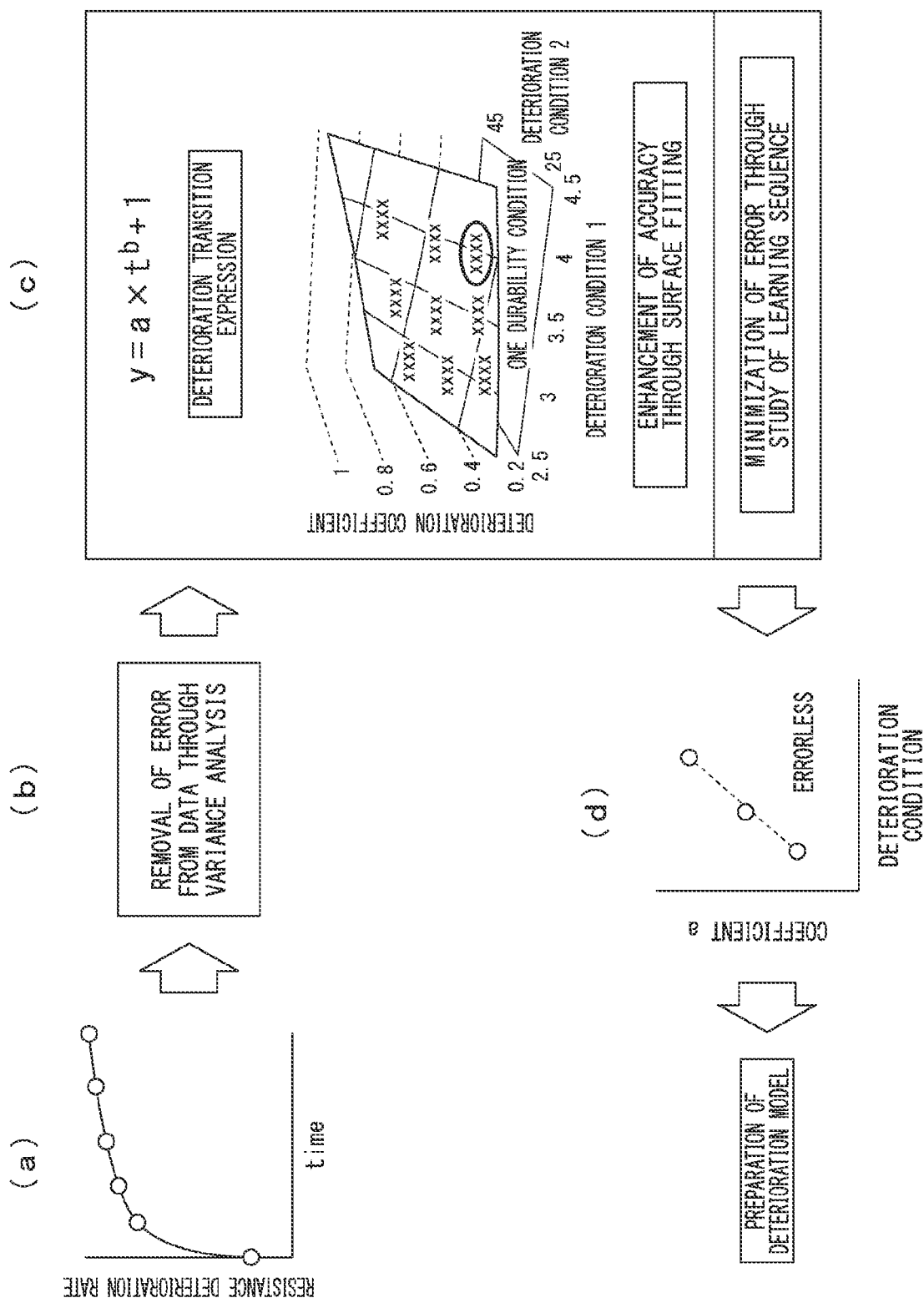
FIG. 4 is a diagram illustrating an example of a process of preparing a deterioration model by modeling resistance deterioration rates of a plurality of batteries acquired in advance using the battery state analysis system according to the embodiment.

FIG. 3 is a diagram schematically illustrating a cell structure of a battery 40 that is mounted in a vehicle 10 employing the battery state analysis system 1 according to the embodiment.

FIGS. 4(a) to 4(d) are diagrams illustrating an example of a process of preparing a deterioration model by modeling resistance deterioration rates of a plurality of batteries acquired in advance using the battery state analysis system 1 according to the embodiment.

In preparing a deterioration model, in general, two models including a neglect model which is prepared from data of a battery neglect test and a cycle model which is prepared from data of a battery cycle test need to be prepared. In the following description, the neglect model will be exemplified in detail.

First, an internal resistance value in a battery 40 including a plurality of cells as illustrated in FIG. 3 is acquired by the battery sensor 42 (see FIG. 2 and the like), characteristic data indicating a resistance deterioration rate is generated by the control unit 36, and a plurality of pieces of characteristic data including the characteristic data is transmitted from the communication device 50 to the server device 200. At this time, multiple tests (acquisition of data) are performed using a plurality of batteries 40. The reason a plurality of batteries 40 are used is that all cells (batteries) do not have the same performance but an error based on individual unevenness is present therebetween.

Then, as illustrated in the graph of FIG. 4(a), a process based on an experimental design method, that is, a so-called Taguchi method, is performed on the resistance deterioration rate based on the internal resistance value acquired from the battery 40 by the diagnosis unit 204 provided in the server device 200, whereby it is possible to generate a plurality of pieces of training data indicating the resistance deterioration rates of a plurality of batteries 40 while reducing the number of tests in comparison with in the related art. In the graph of FIG. 4(a), the horizontal axis represents an observation time, and the vertical axis represents the resistance deterioration rate.

In general, training data acquired using the experimental design method includes individual unevenness between the batteries, an error caused at the time of measurement, or the like.

Then, as illustrated in FIG. 4(b), the diagnosis unit 204 removes the error included in the training data, that is, individual unevenness between the batteries, a measurement error, or the like, by performing a process based on a variance analysis method on the acquired training data.

Here, five factor conditions are given to each piece of the training data, and deterioration behavior for each of the five factors (a charging current, a discharging current, a temperature, a central SOC or voltage in a battery cycle, and ΔSOC) for the deterioration of the battery can also be acquired. On the other hand, in the battery state analysis system 1 according to the embodiment, the diagnosis unit 204 can also generate training data through minimum processes by performing the process based on the variance analysis method on only the training data associated with one factor thereof and performing processes associated therewith on the other four factors.

Then, as illustrated in FIG. 4(c), the diagnosis unit 204 performs surface fitting on the training data from which the error has been removed using the variance analysis method on the basis of a deterioration transition expression expressed by $\{y=a \times t^b+1\}$ (where y is a constant, a is a deterioration condition-dependent coefficient, b is a deterioration mechanism-dependent coefficient, and t is time). Through this process, the deterioration mechanism-dependent coefficient b with which the error is minimized is determined. By performing surface fitting using the aforementioned expression on the basis of the determined deterioration mechanism-dependent coefficient b, a high-accuracy deterioration condition-dependent coefficient a in which the error value is minimized is calculated.

The deterioration condition-dependent coefficient a is expressed, for example, by an expression $\{a=[a_1\times\text{temperature}]+[a_2\times\Delta SOC]+[a_3\times\text{current}]\}$ due to presence of the factors causing a battery to deteriorate.

Through the aforementioned process, a high-accuracy deterioration model is generated by modeling the resistance deterioration rates of a plurality of batteries 40 using the deterioration condition-dependent coefficient a in which the error is minimized, as illustrated in FIG. 4(d).

That is, in calculating the coefficients a and b using the deterioration transition expression, the diagnosis unit 204 can perform derivation of the deterioration mechanism-dependent coefficient b in which the error is minimized and the deterioration condition-dependent coefficient a with high accuracy by optimizing the learning sequence, the process sequence, or the like.

Referring back to FIG. 2, the diagnosis unit 204 outputs information of the analysis result indicating the deterioration state of the battery 40 to the communication unit 202. When an ascertainment request from the user terminal T is output from the communication unit 202, the diagnosis unit 204 outputs information of the analysis result indicating the current deterioration state of the battery 40 using characteristic data collected up to now to the communication unit 202.

The communication unit 202 transmits the information of the analysis result output from the diagnosis unit 204 to the onboard device 100 provided in the vehicle 10 or the user terminal T by communication using the network NW. Accordingly, the analysis result of the deterioration state of the battery 40 from the diagnosis unit 204 is displayed, for example, on the display device by the HMI 60 of the vehicle 10. The analysis result of the deterioration state of the battery 40 from the diagnosis unit 204 may be displayed on the display device of the user terminal T and presented to the user U by the battery ascertainment application.

[Entire Process Flow in Battery State Analysis System]

Figure 5:
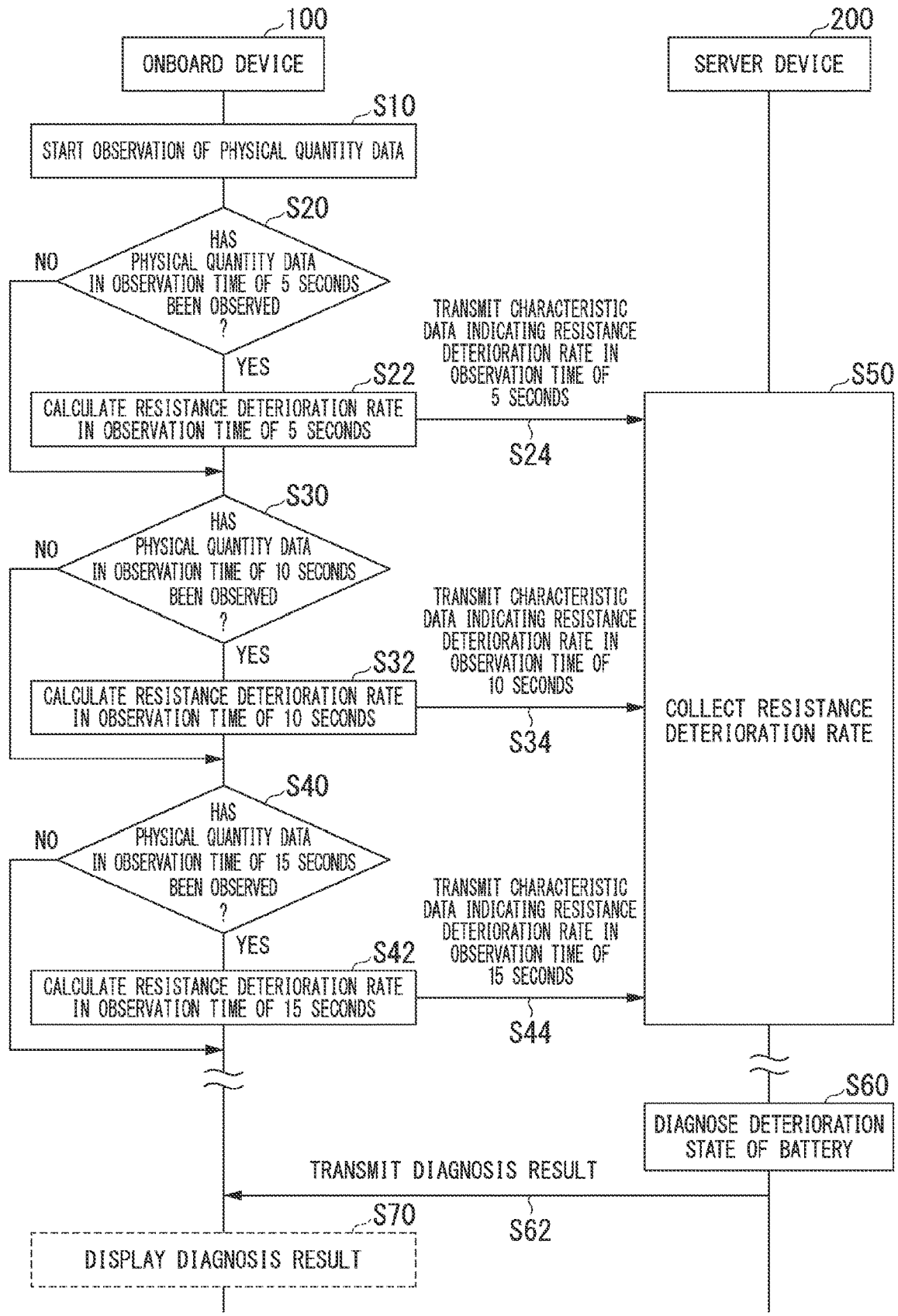
FIG. 5 is a sequence diagram illustrating an example of an entire flow of processes which are performed in the battery state analysis system.

An example of a flow of processes of analyzing (diagnosing or determining) the deterioration state of the battery 40 which is performed in the battery state analysis system 1 as a whole will be described below. FIG. 5 is a sequence diagram illustrating an example of the entire flow of processes in the battery state analysis system 1. FIG. 5 illustrates an example of processes which are performed by the onboard device 100 and the server device 200 which cooperate to analyze the deterioration state of the battery 40 in the battery state analysis system 1. The processes in this sequence diagram are repeatedly performed in a period in which the battery 40 in the vehicle 10 is used. The elements of the onboard device 100 and the server device 200 illustrated in FIG. 2 perform corresponding operations, but it is assumed in the following description that the onboard device 100 and the server device 200 directly transmit and receive information for analyzing the deterioration state of the battery 40 or information of the analysis result for the purpose of easy description. In the following description, it is assumed that the deterioration state of the battery 40 is analyzed on the basis of a deterioration model acquired from a plurality of pieces of characteristic data. Observation of physical quantity data of the battery 40 is performed by the onboard device 100 regardless of whether the battery 40 is charged or discharged, but it is assumed that in the following description that observation of physical quantity data is started when the battery 40 is discharged for the purpose of easy description.

In the example of the routine in the battery state analysis system 1 illustrated in FIG. 5, first, when use of the battery 40 in the vehicle 10 is started and the battery 40 discharges electric power, the onboard device 100 starts observation of physical quantity data of the battery 40 (Step S10).

Thereafter, the onboard device 100 ascertains whether physical quantity data in the observation time (the discharging time) of 5 seconds has been observed (Step S20). That is, the onboard device 100 ascertains whether physical quantity data in the state in which the battery 40 continues discharge electric power can be observed in the discharging time of 5 seconds. When it is ascertained in Step S20 that physical quantity data in the discharging time of 5 seconds has been observed, the onboard device 100 calculates the resistance deterioration rate in the observation time (the discharging time) of 5 seconds in the battery 40 on the basis of the observed physical quantity data (Step S22). Then, the onboard device 100 generates characteristic data indicating the calculated resistance deterioration rate in the observation time (the discharging time) of 5 seconds and transmits the characteristic data to the server device 200 (Step S24). Accordingly, the server device 200 collects the characteristic data transmitted from the onboard device 100 as a characteristic data group in the discharging time of 5 seconds (Step S50). The onboard device 100 causes the routine to proceed to Step S30.

On the other hand, when it is ascertained in Step S20 that physical quantity data in the discharging time of 5 seconds has not been observed, the onboard device 100 causes the routine to proceed to Step S30. When physical quantity data in the discharging time of 5 seconds has not been observed in Step S20, it happens, for example, in a case in which the battery 40 is switched from a discharging state to a charging state in the discharging time of 5 seconds. In this case, the onboard device 100 starts observation of physical quantity data in the observation time (the discharging time) of 5 seconds in the state in which the battery 40 is being charged.

Subsequently, the onboard device 100 ascertains whether physical quantity data in the observation time (the discharging time) of 10 seconds has been observed (Step S30). That is, the onboard device 100 ascertains whether physical quantity data in the state in which the battery 40 continues to discharge electric power can be observed in 5 seconds subsequent to the discharging time of 5 seconds or in 10 seconds starting after the ascertainment of Step S20 or from a timing other than the start timing of the discharging time of 5 seconds. When it is ascertained in Step S30 that physical quantity data in the discharging time of 10 seconds has been observed, the onboard device 100 calculates the resistance deterioration rate in the observation time (the discharging time) of 10 seconds in the battery 40 on the basis of the observed physical quantity data (Step S32). Then, the onboard device 100 generates characteristic data indicating the calculated resistance deterioration rate in the observation time (the discharging time) of seconds and transmits the characteristic data to the server device 200 (Step S34). Accordingly, the server device 200 collects the characteristic data transmitted from the onboard device 100 as a characteristic data group in the discharging time of 10 seconds in Step S50. The onboard device 100 causes the routine to proceed to Step S40.

On the other hand, when it is ascertained in Step S30 that physical quantity data in the discharging time of 10 seconds has not been observed, the onboard device 100 causes the routine to proceed to Step S40. When physical quantity data in the discharging time of 10 seconds has not been observed in Step S30, it happens, for example, in a case in which the battery 40 is switched from the discharging state to the charging state in 5 seconds subsequent to the discharging time of 5 seconds or in the discharging time of 10 seconds.

In this case, the onboard device 100 starts observation of physical quantity data in the observation time (the discharging time) of 10 seconds in the state in which the battery 40 is being charged.

Subsequently, the onboard device 100 ascertains whether physical quantity data in the observation time (the discharging time) of 15 seconds has been observed (Step S40). That is, the onboard device 100 ascertains whether physical quantity data in the state in which the battery 40 continues to discharge electric power can be observed in 5 seconds subsequent to the discharging time of 10 seconds or in 15 seconds starting after the ascertainment of Step S30 or from a timing other than the start timing of the discharging time of 5 seconds or the discharging time of 10 seconds. When it is ascertained in Step S40 that physical quantity data in the discharging time of 15 seconds has been observed, the onboard device 100 calculates the resistance deterioration rate in the observation time (the discharging time) of 15 seconds in the battery 40 on the basis of the observed physical quantity data (Step S42). Then, the onboard device 100 generates characteristic data indicating the calculated resistance deterioration rate in the observation time (the discharging time) of 15 seconds and transmits the characteristic data to the server device 200 (Step S44). Accordingly, the server device 200 collects the characteristic data transmitted from the onboard device 100 as a characteristic data group in the discharging time of 15 seconds in Step S50. The onboard device 100 continues to observe physical quantity data in a next observation time (discharging time).

On the other hand, when it is ascertained in Step S40 that physical quantity data in the discharging time of 15 seconds has not been observed, the onboard device 100 continues to observe physical quantity data in a next observation time (discharging time). When physical quantity data in the discharging time of 15 seconds has not been observed in Step S40, it happens, for example, in a case in which the battery 40 is switched from the discharging state to the charging state in 5 seconds subsequent to the discharging time of 10 seconds or in the discharging time of 15 seconds. In this case, the onboard device 100 starts observation of physical quantity data in the observation time (the discharging time) of 15 seconds in the state in which the battery 40 is being charged.

Thereafter, the server device 200 analyzes the deterioration state of the battery on the basis of the characteristic data groups including characteristic data in the observation times collected in Step S50 (Step S60). The timing at which the server device 200 starts analysis of the deterioration state of the battery 40 in Step S60 is an arbitrary timing. For example, the server device 200 may start analysis of the deterioration state of the battery 40 after collecting characteristic data in a reference observation time (for example, characteristic data in the discharging time of 5 seconds) by a data volume required for analyzing the deterioration state of the battery 40. For example, the server device 200 may start analysis of the deterioration state of the battery after collecting characteristic data in the observation time used to correct the analysis result of the deterioration state of the battery 40 (for example, characteristic data in the discharging time of 10 seconds or 15 seconds) by a data volume required for correcting the analysis result of the deterioration state of the battery 40. For example, the server device 200 may start analysis of the deterioration state of the battery 40 when an ascertainment request for the battery 40 transmitted from the user terminal T is received.

Then, the server device 200 transmits information of the analysis result of the deterioration state of the battery 40 to the onboard device 100 (Step S62). Accordingly, the onboard device 100 outputs the information of the analysis result of the deterioration state of the battery 40 transmitted from the server device 200 to, for example, the HMI 60 provided in the vehicle 10 and causes the HMI 60 to display the information on the display device and to present the information to the user of the vehicle 10 (Step S70).

In the battery state analysis system 1, the onboard device 100 provided in the vehicle 10 in which the battery 40 is mounted and the server device 200 cooperate to analyze the deterioration state of the battery 40 through this entire flow of the routine. At this time, in the battery state analysis system 1, the onboard device 100 performs a partial process (a process of calculating a resistance deterioration rate in a predetermined observation time) associated with analysis of the deterioration state of the battery 40, generates characteristic data indicating the resistance deterioration rate used for analysis of the deterioration state of the battery 40, and transmits the generated characteristic data to the server device 200. Accordingly, in the battery state analysis system 1, in comparison with a case in which the onboard device 100 analyzes the deterioration state of the battery 40, a calculational load in the onboard device 100 can be reduced and the server device 200 can analyze the deterioration state of the battery 40 with higher accuracy and manage the deterioration state of the battery 40 provided in the vehicle 10.

In the battery state analysis system 1, since the characteristic data of the battery which the onboard device 100 transmits to the server device 200 is characteristic data generated by the onboard device 100, for example, a data volume thereof is less than that of the physical quantity data detected by the battery sensor 42. Accordingly, with the battery state analysis system 1, it is possible to curb pressure of a communication band of information (data) in the network NW between the onboard device 100 and the server device 200.

In the battery state analysis system 1, the analysis result of the deterioration state of the battery 40 from the server device 200 may be transmitted to the user terminal T. Accordingly, for example, the user of the user terminal T (user U) such as a driver of the vehicle 10 can ascertain the current deterioration state of the battery 40 at an arbitrary timing even when the user U is not in the vehicle 10.

The flow of processes performed by the server device 200 and the user terminal T includes transmitting an ascertainment request from the user terminal T in which the battery ascertainment application is being executed to the server device 200 and transmitting the analysis result of the deterioration state of the battery 40 from the server device 200 to the user terminal T, which can be easily understood. Accordingly, detailed description of the flow of processes performed by the server device 200 and the user terminal T will be omitted.

With the battery state analysis system performing processes through the flow of processes illustrated in the sequence diagram of FIG. 5, the onboard device provided in the vehicle 10 observes detected physical quantities of the battery in a plurality of different observation times, calculates characteristics associated with change of the battery state, and transmits generated characteristic data to the server device. In the battery state analysis system according to the embodiment, the server device separately collects characteristic data indicating the characteristics associated with the change in battery state transmitted from the onboard device for each observation time and analyzes the deterioration state of the battery on the basis of characteristic data groups indicating the collected characteristics associated with the change in battery state. Accordingly, with the battery state analysis system according to the embodiment, the server device can analyze the deterioration state of the battery with high accuracy and manage the deterioration state of the battery provided in the vehicle. In the battery state analysis system according to the embodiment, since the onboard device transmits characteristic data on which a process of calculating characteristics associated with the change in battery state has been completed to a certain extent to the server device, it is possible to analyze and manage the deterioration state of the battery in a state in which pressure of a communication band of information (data) in the network NW between the onboard device and the server device has been curbed.

In the aforementioned battery state analysis system according to the embodiment, the onboard device 100 includes the battery sensor 42 configured to acquire physical quantity data indicating physical quantities associated with the state of the battery 40 mounted in the vehicle 10, the control unit 36 that observes characteristics associated with the change in state of the battery 40 on the basis of the physical quantity data, and the communication device 50 that transmits a plurality of pieces of characteristic data to the server device 200. The server device 200 includes the communication unit 202 configured to receive the plurality of pieces of characteristic data transmitted from the onboard device 100 and the diagnosis unit 204 configured to prepare a deterioration model by modeling the resistance deterioration rates of a plurality of batteries 40 acquired in advance and to analyze the deterioration state of the battery 40 on the basis of the result of comparison between the deterioration model and the plurality of pieces of characteristic data. In the battery state analysis system according to the embodiment, the diagnosis unit 204 generates training data indicating the resistance deterioration rates by processing the resistance deterioration rates of the plurality of batteries 40 using the experimental design method, removes an error by processing the training data using the variance analysis method, and prepares a deterioration model by performing surface fitting on the basis of the deterioration transition expression expressed by $\{y=a \times t^b+1\}$ (where y is a constant, a is a deterioration condition-dependent coefficient, b is a deterioration mechanism-dependent coefficient, and t is time). Accordingly, since the deterioration model hardly including an error or an error value is obtained, it is possible to accurately detect and determine to what extent the battery 40 has deteriorated from the initial state by analyzing the deterioration state of the battery 40 on the basis of the result of comparison between the deterioration model and the plurality of pieces of characteristic data. As a result, in the vehicle 10 employing the battery state analysis system, the server device 200 can manage the deterioration state of the battery 40 provided in the vehicle 10 with higher accuracy, and it is possible to improve convenience for use of the vehicle 10, for example, by notifying the user of the vehicle 10 of the state in which a distance which the vehicle 10 can travel decreases markedly in advance.

The aforementioned embodiment can also be described as follows:

A battery state analysis system including at least a server device that analyzes a state of a battery,
wherein the server device includes:
a hardware processor; and
a storage device storing a program, and
wherein the hardware processor reads and executes the program stored in the storage device to perform:
receiving a plurality of pieces of characteristic data indicating characteristics associated with change of the state of the battery based on physical quantity data indicating a physical quantity associated with the state of the battery;
preparing a deterioration model by modeling resistance deterioration rates of a plurality of batteries which have been acquired in advance and analyzing a deterioration state of the battery on the basis of a result of comparison between the deterioration model and the plurality of pieces of characteristic data;
generating training data indicating the resistance deterioration rates of the plurality of batteries by performing a process based on an experimental design method on the resistance deterioration rates of the plurality of batteries acquired in advance;
removing an error included in the training data by performing a process based on a variance analysis method on the training data; and
modeling the resistance deterioration rates of the plurality of batteries to prepare the deterioration model by determining a deterioration mechanism-dependent coefficient b with which the error is minimized through performing surface fitting on the training data from which the error has been removed using the variance analysis method on the basis of a deterioration transition expression expressed by $\{y=a \times t^b+1\}$ (where y is a constant, a is a deterioration condition-dependent coefficient, b is a deterioration mechanism-dependent coefficient, and t is time) and calculating the deterioration condition-dependent coefficient a through performing surface fitting using the deterioration transition expression on the basis of the determined deterioration mechanism-dependent coefficient b.

In the embodiment, it is assumed that the vehicle 10 employing the battery state analysis system is a BEV. However, the electric vehicle may be, for example, a hybrid electric vehicle (HEV) that travels with a motor (an electric motor) which is driven using electric power supplied with operation of an internal combustion engine such as an engine operating with fuel or electric power supplied from a traveling battery (a lithium-ion battery). Accordingly, the battery state analysis system can also be employed by the hybrid electric vehicle. In this case, in the hybrid electric vehicle, an observation time of a target for which physical quantity data is to be observed is used to analyze the deterioration state of the battery even when the internal combustion engine operates to charge the battery. In this case, the server device can analyze the deterioration state of the battery mounted in the hybrid electric vehicle with higher accuracy as described above. The entire flow of processes in the battery state analysis system employed by the hybrid electric vehicle can be easily understood by considering it to be the same as the entire flow of processes in the battery state analysis system employed by the BEV according to the embodiment. Accordingly, detailed description of the entire flow of processes in the battery state analysis system employed by the hybrid electric vehicle will be omitted.

For example, an electric vehicle traveling with an electric motor which is driven using electric power supplied from a fuel cell such as a fuel cell vehicle (FCV) can also be considered. The battery state analysis system can also be employed by the fuel cell vehicle. In this case, the battery described in the embodiment is replaced with a fuel cell. The fuel cell also deteriorates in the process of use thereof due to reasons different from those of the battery. Accordingly, the battery state analysis system can also be employed by the fuel cell vehicle. Here, physical quantities which are observed in the onboard device and processes of analyzing the deterioration state which are performed by the server device correspond to the fuel cell mounted in the fuel cell battery. On the other hand, the entire flow of processes in the battery state analysis system employed by the fuel cell vehicle can be easily understood by considering it to be the same as the entire flow of processes in the battery state analysis system employed by the BEV according to the embodiment. Accordingly, detailed description of the entire flow of processes in the battery state analysis system employed by the fuel cell vehicle will be omitted.

While a mode for carrying out the present invention has been described above with reference to an embodiment, the present invention is not limited to the embodiment, and various modifications and substitutions can be performed thereon without departing from the gist of the present invention.

What is claimed is:

1. A battery state analysis system comprising:
a server device, located remote from a vehicle, that analyzes a state of a battery of the vehicle,
the server device comprises:
a storage device that stores computer executable units; and
a processor that executes the computer executable units stored in the storage device, wherein the computer executable units comprise:
a reception unit configured to receive a plurality of pieces of characteristic data indicating characteristics associated with change of the state of the battery based on physical quantity data indicating a physical quantity associated with the state of the battery; and
an analysis unit configured to prepare a deterioration model by modeling resistance deterioration rates of a plurality of batteries which have been acquired in advance and to analyze a deterioration state of the battery on the basis of a result of comparison between the deterioration model and the plurality of pieces of characteristic data; and
a display device, operatively connected to the vehicle, that receives, from the analysis unit the deterioration model and outputs information indicative of the deterioration model to an occupant of the vehicle,
wherein the analysis unit is configured to:
generate training data indicating the resistance deterioration rates of the plurality of batteries by performing a process based on an experimental design method on the resistance deterioration rates of the plurality of batteries acquired in advance;
remove an error included in the training data by performing a process based on a variance analysis method on the training data; and
model the resistance deterioration rates of the plurality of batteries to prepare the deterioration model by determining a deterioration mechanism-dependent coefficient b with which the error is minimized through performing surface fitting on the training data from which the error has been removed using the variance analysis method on the basis of a deterioration transition expression expressed by $\{y=a\times t^b+1\}$ (where y is a constant, a is a deterioration condition-dependent coefficient, b is a deterioration mechanism-dependent coefficient, and t is time) and calculating the deterioration condition-dependent coefficient a through performing surface fitting using the deterioration transition expression on the basis of the determined deterioration mechanism-dependent coefficient b.

2. A battery state analysis method using a battery state analysis system including a server device, located remote from a vehicle, that analyzes a state of a battery of the vehicle, the battery state analysis method being performed by a computer of the server device, the battery state analysis method comprising:
receiving a plurality of pieces of characteristic data indicating characteristics associated with change of the state of the battery based on physical quantity data indicating a physical quantity associated with the state of the battery;
preparing a deterioration model by modeling resistance deterioration rates of a plurality of batteries which have been acquired in advance and analyzing a deterioration state of the battery on the basis of a result of comparison between the deterioration model and the plurality of pieces of characteristic data;
generating training data indicating the resistance deterioration rates of the plurality of batteries by performing a process based on an experimental design method on the resistance deterioration rates of the plurality of batteries acquired in advance;
removing an error included in the training data by performing a process based on a variance analysis method on the training data;
modeling the resistance deterioration rates of the plurality of batteries to prepare the deterioration model by determining a deterioration mechanism-dependent coefficient b with which the error is minimized through performing surface fitting on the training data from which the error has been removed using the variance analysis method on the basis of a deterioration transition expression expressed by $\{y=a\times t^b+1\}$ (where y is a constant, a is a deterioration condition-dependent coefficient, b is a deterioration mechanism-dependent coefficient, and t is time) and calculating the deterioration condition-dependent coefficient a through performing surface fitting using the deterioration transition expression on the basis of the determined deterioration mechanism-dependent coefficient b; and
outputting, via a display device operatively connected to the vehicle, information indicative of the deterioration model to an occupant of the vehicle.

* * * * *